United States Patent
Crawford et al.

(10) Patent No.: US 10,511,142 B2
(45) Date of Patent: Dec. 17, 2019

(54) PULSED LASER DIODE DRIVERS AND METHODS

(71) Applicants: Ian D Crawford, Longwood, FL (US); Dwight E Wildon, Orlando, FL (US)

(72) Inventors: Ian D Crawford, Longwood, FL (US); Dwight E Wildon, Orlando, FL (US)

(73) Assignee: Analog Modules, Inc., Longwood, FL (US)

( * ) Notice: Subject to any disclaimer, the term of this patent is extended or adjusted under 35 U.S.C. 154(b) by 0 days.

(21) Appl. No.: 15/954,596

(22) Filed: Apr. 17, 2018

(65) Prior Publication Data

US 2018/0323576 A1    Nov. 8, 2018

Related U.S. Application Data

(60) Provisional application No. 62/500,662, filed on May 3, 2017.

(51) Int. Cl.
| | |
|---|---|
| *H01S 5/042* | (2006.01) |
| *G01S 7/481* | (2006.01) |
| *G01S 7/484* | (2006.01) |
| *H03K 17/691* | (2006.01) |

(Continued)

(52) U.S. Cl.
CPC ............ *H01S 5/0428* (2013.01); *G01S 7/484* (2013.01); *G01S 7/4814* (2013.01); *H02M 1/088* (2013.01); *H02M 3/156* (2013.01); *H02M 3/158* (2013.01); *H03K 17/04123* (2013.01); *H03K 17/691* (2013.01); *H02M 1/32* (2013.01); *H02M 3/335* (2013.01); *H02M 2001/007* (2013.01); *H02M 2001/0048* (2013.01); *H02M 2001/348* (2013.01); *H03K 17/08104* (2013.01); *H05B 33/0815* (2013.01)

(58) Field of Classification Search
CPC ............ H01S 5/0428; H03K 17/04123; H03K 17/691; H03K 17/08104; G01S 7/484; G01S 7/4814; H02M 1/088; H02M 3/158; H02M 3/156; H02M 3/335; H02M 2001/348; H02M 2001/007; H02M 2001/0048; H02M 33/0815

See application file for complete search history.

(56) References Cited

U.S. PATENT DOCUMENTS

| | | |
|---|---|---|
| 5,311,353 A | 5/1994 | Crawford |
| 5,350,134 A | 9/1994 | Crawford |

(Continued)

OTHER PUBLICATIONS

Practical Feedback Loop Design Considerations for Switched Mode Power Supplies, Hangseok Choi, Ph. D, Fairchild Semiconductor Power Seminar 2010-2011, 14pp.

(Continued)

*Primary Examiner* — Yuanda Zhang
(74) *Attorney, Agent, or Firm* — Gerald E. Linden

(57) ABSTRACT

A current driver is disclosed which allows very short pulses at high currents to be generated for high power laser diodes. The parasitic inductance of the laser diode limits the speed at which the laser diode may be turned on and off. A high voltage is used to charge this inductance rapidly and maximize the rise time. The fall time is shortened by allowing a similar high voltage to be generated at turnoff without damage to the laser diode or switching components. A portion of the energy stored in the parasitic inductance may recovered to reduce drain on the power source, and to improve overall efficiency. The anode of the laser may be switched to ground at the end of a pulse.

19 Claims, 6 Drawing Sheets

(51) Int. Cl.
    *H02M 3/158*     (2006.01)
    *H02M 1/088*     (2006.01)
    *H02M 3/156*     (2006.01)
    *H03K 17/0412*     (2006.01)
    *H05B 33/08*     (2006.01)
    *H03K 17/081*     (2006.01)
    *H02M 1/32*     (2007.01)
    *H02M 3/335*     (2006.01)
    *H02M 1/34*     (2007.01)
    *H02M 1/00*     (2006.01)

(56) References Cited

U.S. PATENT DOCUMENTS

| | | | |
|---|---|---|---|
| 6,646,479 B1 | 11/2003 | Crawford | |
| 6,650,404 B1 | 11/2003 | Crawford | |
| 6,697,402 B2 | 2/2004 | Crawford | |
| 7,262,584 B2 | 8/2007 | Crawford et al. | |
| 7,348,948 B2 | 3/2008 | Crawford | |
| 7,545,839 B2 | 6/2009 | Giorgi et al. | |
| 7,756,173 B2 | 7/2010 | Alfrey | |
| 8,184,670 B2 | 5/2012 | Crawford et al. | |
| 2011/0057578 A1* | 3/2011 | Otake | H05B 33/0809 315/291 |
| 2017/0085057 A1 | 3/2017 | Barnes et al. | |

OTHER PUBLICATIONS

Pulse Forming Network, downloaded Apr. 2018 from Wikipedia, https://en.wikipedia.org/wiki/Pulse_forming_network.

* cited by examiner

Prior Art Current Driver

Fast High-Voltage Current Driver with Damping protection circuit for the FET

Fast High-Voltage Current Driver
with Damping

Current Driver
with Energy Recovery

Current Driver
with Synchronous Rectifier

Current Driver
with switched Energy Recovery ative filing of 62/500,662 filed 3 May
PULSED LASER DIODE DRIVERS AND METHODS

CROSS-REFERENCE TO RELATED APPLICATIONS

This is a nonprovisional filing of 62/500,662 filed 3 May 2017.

TECHNICAL FIELD

The invention relates to pulsed current drivers for driving current-driven loads or devices, such as light emitting diodes (LEDs) or laser diodes.

BACKGROUND

Pulsed laser or LED diode drivers (or current drivers) are used to generate pulses of current into a single or typically a series array of laser diodes. The techniques described herein may be applicable to any Laser Diode, LED or similar current-driven load (or device). The light output of an LED or laser diode may be used for various purposes, such as automobile LIDAR (Light Detection and Ranging), rangefinding, or as a light source requiring a short pulse with a high peak power.

As is known, inductors generally oppose changes in current. When the current flowing through an inductor changes, the time-varying magnetic field induces a voltage in the conductor, described by Faraday's law of induction. According to Lenz's law, the direction of induced electromotive force (emf) opposes the change in current that created it.

In some applications, such as described herein, it may be desirable to have a high-speed efficient laser diode driver capable of driving 100 amps or more in a very short time, for example 10 ns. A fundamental problem with this is the inductance of the laser diode, or diode array where multiple laser diodes are connected in series. This inductance may be up to 10 nH or higher even using low inductance practices.

Typically, laser diodes may be damaged by a few volts in the reverse direction and, in the current state of the art, they may conventionally be protected by a fast diode across the laser diode terminals to conduct in the reverse voltage direction. Such a diode may be referred to as a "shunt protective" (or simply "shunt") diode. For short, high-current pulses, this has the undesirable effect of providing a long tail at turn-off as the parasitic inductance dissipates its stored energy through the shunt protective diode at a low voltage, and therefore over a long time interval. It would therefore be desirable to remove the stored energy at a high voltage so that the inductor discharge current can only flow for a very short time using the general relationship:

Time=Inductance×Current(di)/Voltage.

As is evident from the above, a high voltage therefore demands (or results in) a short time interval.

Some Patents and Publications

U.S. Pat. No. 6,697,402 (Analog Modules, Inc.) discloses high-power pulsed laser diode driver, and shows a method of driving the laser inductance quickly using a pre-charged inductor that generates an instantaneous high voltage. More specifically, fast rise time to high currents in a load such as a laser diode array is achieved by connecting an inductor between a power supply and an end of the diode array. A switching element, is connected between the other end of the diode array and ground. A shunt switch is connected across the diode array. When the shunt switch is opened, energy stored in the inductor is suddenly delivered to the diode array. A diode may be connected between the other end of the diode array and the input of the driver. A current monitor may be connected in series with the diode array. An overall system comprises the diode array driver(s) and at least a portion of the power supply—namely, an energy storage capacitor. A value for the energy storage capacitor in the power supply may be selected to produce a maximally flat-top pulse shape. A source voltage provided by the power supply may be greater than, substantially equal to, or less than the voltage required by the diode array. In use, closing the switching element and closing the shunt switch produces an initial current buildup in the inductor, and opening the shunt switch directs the current built up in the inductor into the diode array. Current flow through the diode array is terminated by subsequently closing the shunt switch. With the shunt switch closed, the switching element may be opened, which will cause the current in the inductor to recirculate within a loop comprising the closed shunt switch, the inductor and the diode connected across the series-connected diode array and the coil. Periodically closing the switching element will refresh the recirculating current. Refreshing the current in the inductor for a burst, or very short lead time, may be done by turning on (closing) the switching element for a short time with the shunt switch closed, until the current sensed rises to the desired value.

As further disclosed in U.S. Pat. No. 6,697,402, in use, a first switch is turned on to build up current in the inductor just prior to the laser pulse. During this period, the load (diode array) is shorted out by a second (shunt) switch in series with the first switch. When the desired peak current is reached, the second switch is turned off (opened). Because current flow in an inductor can not change abruptly, the current continues to flow into the load, generating a high voltage, as required, to overcome the reactance of the load and leads. To turn off the pulse, the second switch is turned on, shorting out the load and discharging the lead/load inductance as the falling edge of the pulse. Simultaneously, the first switch is turned off and the energy stored in the series inductor is recycled back into the storage capacitor through a diode.

US 20170085057 (Analog Devices, Inc.) discloses pulsed laser diode driver and a similar (to the aforementioned U.S. Pat. No. 6,697,402) pre-charge solution. Optical systems can emit train(s) of light pulses onto objects to derive a distance between the light source and the object. Achieving meter or centimeter resolution may require very short light pulses. It is not trivial to design a circuit that can generate narrow current pulses for driving a diode that emits the light pulses. A driver circuit has a pre-charge path comprising one or more inductive elements and a fire path comprising the diode. Switches in the driver circuit are controlled with predefined states during different intervals to pre-charge current in the one or more inductive elements prior to flowing current through the fire path to pulse the diode.

U.S. Pat. No. 7,262,584 (Analog Modules, Inc.) discloses efficient fast pulsed laser or light-emitting diode driver, and shows a charged capacitor switched into a laser diode. A capacitor is connected to the output of a multiphase power converter, and a current-driven device (e.g., LED or laser diode) is also connected to the power converter output. A solid state switch (FET or IGBT) is connected in series with the current-driven device. Means are provided for sensing current through the current-driven device. An error amplifier compares sensed current through the current-driven device with a current level demand signal and controls the output of the power converter. Means are provided for turning the switch on and off and may be (i) a fast comparator receiving a voltage reference signal at one input and the current level demand signal at another input, and outputting the switch on/off signal to the switch or (ii) an externally-generated logic signal provided directly to the switch.

U.S. Pat. No. 8,184,670 (Analog Modules, Inc.) discloses smart linear pulsed laser diode driver, and method, and shows that the capacitor voltage may be adjusted to control the efficiency of the laser diode driver. In a pulsed laser diode driver an energy storage capacitor is continuously being charged to a supply voltage Vr. When a pulse is initiated, energy stored in the capacitor is delivered to the laser diode load. The capacitor voltage Vd at the end of a pulse is used to control Vr to ensure that Vd is maintained above a minimum voltage Vm required to ensure operation of a current control device (such as an FET) just above saturation. Test pulses (such as with attenuated currents or reduced pulse width) may be fired to determine an initial optimum value for Vr. After a test pulse, a slightly high estimate for Vr may be used and may be iterated (incremented) down to an optimum value Vm during a firing burst. A digital processor may be used to calculate and store data to optimize the performance. Various embodiments are disclosed. This illustrates the concept of adjusting the power supply voltage to assist in regulation, but strictly does not apply to a current-controlled device by definition.

U.S. Pat. No. 7,545,839 (Optiswitch Technology Corporation) discloses apparatus and method for driving a pulsed laser diode, and specifies a high starting voltage to achieve a fast rise time followed by a lower voltage slow discharge to maintain the current efficiently. To achieve both a fast risetime and a desired flat top current pulse, or to be able to independently specify a risetime and pulse width (energy), a supplemental or "fast" voltage discharge stage (or multiple supplemental or "fast" voltage discharge stages) having a faster and shorter voltage discharge characteristic and a higher starting voltage relative to the main or "slow" voltage discharge stage is used in parallel with the slow voltage discharge stage. The energy storage element of the slow voltage discharge stage has sufficient energy storage at an appropriate voltage level for maintaining the desired flat top current throughout the pulse duration, while the energy storage element of the fast voltage discharge stage has less energy storage capability but a higher starting voltage for achieving the desired fast current pulse risetime. Preferably, a single closing switch is used to couple all energy storage elements to the laser diode to pulse it, although respective separate switches may be used to couple the energy storage elements of the various voltage discharge stages to the laser diode.

SUMMARY

It is an object of the invention, generally, to provide improved pulsed laser diode drivers and methods.

A pulsed current driver is described which is capable of driving very short, high-current pulses into current-driven devices (loads) such as a laser diode.

It is desired to provide for a short pulse width that requires a fast fall time. For LIDAR applications, a sharp pulse is desirable for the best range definition. A slow discharge would not be desirable as it reduces efficiency and wastes energy.

It is desired to provide for energy efficiency, such as by energy recovery, if possible. The techniques described herein provide for energy recovery from parasitic inductances in the load.

According to the invention, generally, an energy storage capacitor is charged by a power source to a relatively high voltage, as compared to the requirements of a load. The load, for example, may be an LED, or laser diode, or a series array of laser diodes, or other current-driven device(s). The load has a parasitic inductance. The method generally involves generating short pulses by achieving both a fast turn-on and turn-off speed and, optionally, recovering a potion of the stored energy in the load's parasitic inductance back to the power source.

A high-speed switch, such as a Gallium Nitride FET, may be connected in series with the load and may be turned on by an input pulse to allow the capacitor to discharge through the load. The FET may be turned off quickly to terminate the flow (or pulse) of current from the capacitor, but some current will remain flowing in the load's parasitic inductance. This generates a high voltage at the switch (FET) that is managed (damped) to avoid ringing and laser diode reverse damage, and to reduce the current draw from the energy storage capacitor by stopping or slowing down the rate of discharge of the energy storage capacitor.

According to the invention, generally, a current driver is disclosed that allows very short pulses at high currents to be generated for high power laser diodes. The parasitic inductance of the laser diode limits the speed at which the laser diode may be turned on and off. A high voltage is used to charge this inductance rapidly and minimize the rise time. The fall time is shortened by allowing a similar high voltage to be generated at turnoff without damage to the laser diode or switching components. A portion of the energy stored in the parasitic inductance may recovered to reduce drain on the power source, and to improve overall efficiency. The anode of the laser may be switched to ground at the end of a pulse.

According to some embodiments (examples) of the invention, a pulsed current driver for driving a current-driven load may comprise: a power source providing, in use, an output on a high voltage line to a first terminal of a current-driven load, wherein the current-driven load has a parasitic inductance and a second terminal; an energy storage capacitor connected between the high voltage line and ground; a switching device capable of connecting a second terminal of the current-driven load to ground in a controlled, intermittent manner; and an input line capable of providing an input pulse to the switching device; and may further comprise: a damping circuit having an input connected to the second terminal of the current-driven load and an output connected to the high voltage line, wherein the damping circuit comprises a rectifying device and a damping device connected in series with the rectifying device.

The rectifying device may be selected from the group consisting of fast diode and synchronous rectifier. The current-driven load may be selected from the group consisting of light emitting diode (LED), laser diode, and an array of diodes.

The switching device may comprise at least one electrical component which can change impedance rapidly. The switching device may comprise at least two electrical components connected in series with one another. The switching device may comprise at least one electrical component selected from the group consisting of FET, Gallium Nitride (GaN) FET, and Silicon Carbide (SiC) FET.

A pulse transformer may receive the input pulse at a primary winding thereof, and may have a number of secondary (gate) windings corresponding to the number of electrical components of the switching device, wherein the secondary windings control the turning on (and off) of the electrical components of the switching device, in response to the input pulse.

An energy recovery circuit may be connected between the output of the damping circuit and the high voltage line, the energy recovery circuit comprising a second energy storage capacitor. A low power voltage source may be connected to the second energy storage capacitor.

A buck or boost converter may be connected between the second energy storage capacitor and the high voltage line or powering an external load.

The rectifying device may comprise a synchronous rectifier operating in response to a delayed pulse provided to an input of the synchronous rectifier. The delayed pulse may starts after the input pulse and may have a longer duration than the input pulse.

A switch may be provided for alternately connecting the first terminal of the load to the high voltage line and ground, in response to a delayed pulse. The delayed pulse may start after the input pulse.

The energy storage capacitor may be replaced with a pulse forming network.

The switching device may comprise an FET switch. A filter capacitor may be connected to the power source output, a clamp diode (or a synchronous rectifier) may be connected (disposed) between the FET switch and the power source output, and a charging resistor may be connected (disposed) between the power source output (or the filter capacitor) and the energy storage capacitor (or the high voltage line).

According to some embodiments (examples) of the invention, a method for driving an LED or laser diode load with a current pulse, wherein the load has a parasitic inductance, may comprise:

with a power supply, providing a high voltage on a high voltage line;

connecting an energy storage capacitor to the high voltage line;

connecting a first terminal of the load to the high voltage line;

in response to an input pulse, with a switching device, intermittently connecting a second terminal of the load to ground; and providing a damping circuit between the second terminal of the load and the high voltage line.

The damping circuit may return residual current to the energy storage capacitor to reduce (or cancel) current flow to the laser diode load, thereby reducing energy loss.

An energy recovery circuit may be connected between the damping circuit and the high voltage line. The energy recovery circuit may comprise a second energy storage capacitor and a buck or boost converter connected between the second energy storage capacitor and the high voltage line or an external load. The method may further comprise: controlling operation of the converter by conventional regulating means when the voltage on the capacitor increases above a threshold; and if necessary, reducing the amount of energy from the power supply accordingly so that the voltage on the high voltage line may be regulated at an optimum value.

The method may further comprise: switching the first terminal of the load between the high voltage line and ground, in response to a delayed pulse, wherein the delayed pulse starts after the input pulse.

The switching device may comprise at least one FET. The method may further comprise:

choosing components of the damping circuit such that a breakdown voltage of the FET is not exceeded, with the voltage being as high as possible (near the breakdown voltage of the FET) to discharge and dissipate or recover quickly energy stored in a parasitic inductance of the load.

A current pulse amplitude may be controlled by at least one of: the time of the input pulse, the level of the input pulse, the voltage on the energy storage capacitor, the power supply energy; sensing a discharged voltage of the energy storage capacitor after the pulse and adjusting another control parameter, sensing current flow through the load using one or more of a Hall effect sensor, a resistor in series with the current loop, a flyback voltage from the parasitic inductor, and a photo sensor looking at the light output of the LED or laser diode load.

It may be noted that the Optiswitch patent (referenced above) is directed to having a longer pulse. When the initial voltage spike to give a fast rise time is over, the diode emitter is run at a low voltage for efficiency.

In contrast with the Optiswitch patent, the techniques described herein seek to provide the narrowest possible pulse. The Optiswitch patent does not really address the fall time issues or component damage, but by turning the switch off, the stored energy in the load inductor may dissipate quickly in losses due to a high voltage change rate being generated.

Other objects, features and advantages of the invention will become apparent in light of the following description thereof.

BRIEF DESCRIPTION OF THE DRAWING(S)

The structure, operation, and advantages of the present preferred embodiment of the invention will become further apparent upon consideration of the descriptions set forth herein, taken in conjunction with the accompanying figures (FIGs). The figures are intended to be illustrative, not limiting. Legends in the drawings may be considered as part of the description.

DETAILED DESCRIPTION

Figure 1:
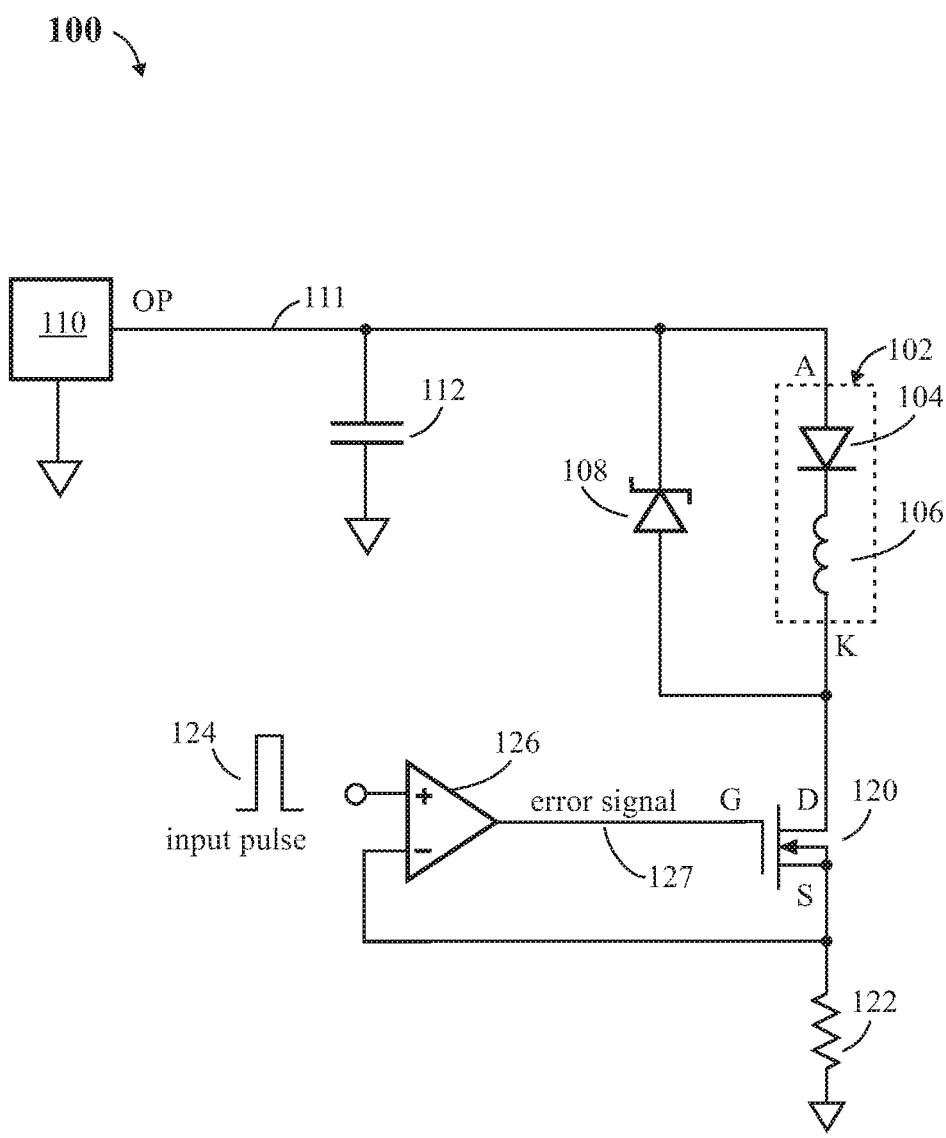
FIG. 1 is a schematic diagram of a prior art current driver.

Reference will be made in detail to various embodiments of the invention, examples of which are illustrated in the accompanying drawings. The drawings are intended to be illustrative, not limiting. Although the invention will be described in the context of these embodiments, it should be understood that it is not intended to limit the spirit and scope of the invention to these particular embodiments.

Many of the elements in the drawings are standard electronic components (resistors, capacitors, LEDs, inductors, comparators, diodes, transistors, FETs, etc.). Parasitic inductances may be shown, using the symbol for an inductor component.

Components such as resistors and capacitors typically have two terminals, which may be referred to herein as "ends". Some components, such as FETs, typically have three terminals, which may be labeled S, G, D (for source, gate and drain, respectively). In some instances, "signals" may be referred to, and reference numerals may point to lines (conductive paths) that carry said signals.

In the schematic diagrams presented herein, the various electronic components may be connected to one another, as shown, whether or not a given connection is explicitly mentioned in the text.

According to the invention, generally, a pulsed current driver is described which is (i) capable of driving very short high-current pulses into current-driven devices (loads) such as a laser diode, and which may feature (ii) damping and (iii) energy recovery.

Additionally, by allowing the energy storage capacitor to discharge during the pulse, more voltage headroom is created to allow a fast turn off and possible energy recovery. This energy discharge also helps protect the switching device and diode emitter by limiting the energy available in the case of an inadvertent longer turn-on input pulse. It is clear that according to the invention, a higher voltage just below the switch (FET) breakdown may be used to achieve a faster initial risetime, when compared to the fixed voltage power source of prior art requiring turn-off voltage transient headroom at the switch.

FIG. 1 shows an exemplary pulsed current driver 100 of the prior art. Generally, the current driver receives an input pulse, and drives a current-driven load or device, such as a light emitting diode (LEDs) or a laser diode, or arrays thereof.

The load may a laser diode 102 comprising the diode itself 104 and an inherent (or parasitic) inductance 106. The anode of the laser diode is labeled "A", the cathode of the laser diode is labeled "K". The load 102 may comprise a series-connected array of laser diodes. A Schottky diode 108 may be connected (shunted) across the laser diode (or array) 102 to prevent any reverse voltage across the laser diode (or array) 102. It should be understood, that the laser diode (or array) 102 does not form a part of the current driver, per se.

The current driver 100 may comprise a power source (or supply) 110 having an output "OP" on a line 111 for charging an energy storage capacitor 112 to a voltage slightly greater than the requirements of the laser diode. The energy storage capacitor 112, which may simply be referred to as "capacitor" is shown connected between the line 111 and ground—in other words, across the output of the power source. In some cases, the capacitor 112 may be self-contained within the power source 110, and the capacitor 112 may be considered to be part of an overall power source (110+112).

A switch (or switching device), such as an FET 120 is connected, as shown, in series, between the laser diode (or array) 102 and a current sense resistor 122 which is connected to ground. The FET 120 is described as a "switch", but any device (electrical component or components) which can change impedance rapidly may be utilized to perform the function of the switch. Current flow through the laser diode (or array) is sensed by the current sense resistor 122. The switch 120 is comparable to the "switching element" 118 which is described, for example, in the aforementioned U.S. Pat. No. 6,697,402.

For creating and controlling current pulses through the laser diode (or array) 102, an external pulse source ("input pulse", or "input signal") 124 may be provided to the "+" input terminal of an error amplifier 126. The "−" input of the error amplifier 126 is connected to the current sense resistor 122, as shown. The input pulse may be a time varying signal used to control current flowing through the laser diode (or array), and may be referred to as "demand voltage".

The output (error signal) of the error amplifier 126 is provided on a line 127 to the gate "G" of the FET 120, turning it on (and off) in response to the input signal (input pulse). The FET gate "G" is driven from the error signal to control a scaled (proportion to the input signal) current flow through the laser diode (or array) as measured by sense resistor 122 which matches (is proportional to) the input pulse demand voltage. In this regard, the FET (in conjunction with the power source 110 and capacitor 112) may be considered to be operating as a linear pulsed current source. The rise time of the current is controlled by the circuit inductances, the FET speed, the power voltage, and the ability of the error amplifier to track the input pulse and drive the FET input capacitance.

In some cases, the current control loop may be eliminated by grounding the source S and applying the input pulse directly to the gate G. The current is controlled by a very short gate input pulse using the limiting effects of the series inductances. Of course this limits the pulse width range and may cause damage due to excessive current if a wider pulse is applied. The effects of the stored energy in the load inductance is generally ignored and this energy dissipates in circuit losses.

In the figures (FIG. 2, et seq.) that follow, various embodiments of the invention may be described, and may include some elements that were presented in FIG. 1, such as the power source having an output "OP" on a line for charging an energy storage capacitor, a laser diode (or array of laser diodes) having parasitic inductance, an input pulse, and a FET operating as a switch disposed between the laser diode and ground. Generally, an error amplifier (compare 126) is not included, since it may limit the speed of the laser pulses, and this subsequently eliminates the need for a current sense resistor (122) with its associated parasitic inductance. Generally, a Schottky diode (compare 108) connected across the array is not included, since residual energy in the parasitic inductance (of the LED array) will be dissipated at a low voltage drop over a relatively long period, resulting in a slow turn-off.

Figure 2:
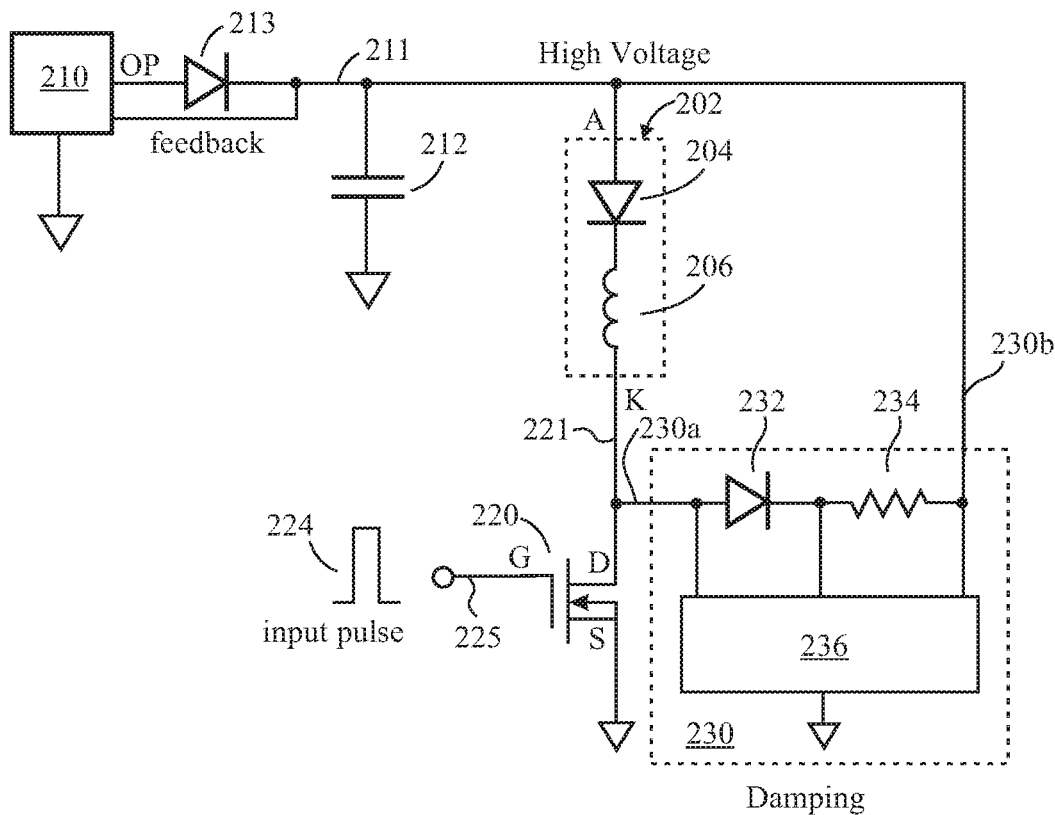
FIG. 2 is a schematic diagram of a fast high-voltage current driver, with damping, according to an embodiment of the invention.

FIG. 2 is a schematic diagram of an embodiment of a pulsed current driver 200 of the present invention. Generally, the current driver receives an input pulse, and drives a current-driven load or device, such as a light emitting diode (LEDs) or a laser diode, or an array of diodes.

The load may be a laser diode 202 (compare 102) comprising the diode itself 204 (compare 104) and a parasitic inductance 206 (compare 106). The anode (terminal) of the laser diode is labeled "A", the cathode (terminal) of the laser diode is labeled "K". The load may comprise an array of laser diodes (typically, series-connected with one another). It should be understood, that the laser diode (and its parasitic inductance) do not form a part of the current driver, per se.

The current driver 200 may comprise a power source (or supply) 210 (compare 110) having an output "OP" on a line 211 for charging an energy storage capacitor 212 to a voltage which is much higher than the laser diode (or array) operating voltage. The charging method may be the well-known technique of a flyback power supply (https://en.wikipedia.org/wiki/Flyback_converter) via a "flyback" diode 213 to charge the energy storage capacitor 212 efficiently and is not affected by any rapid discharges of the energy storage capacitor 212. The quiescent voltage on the high voltage line 211 is regulated by feedback, as is well known, and is set below the breakdown voltage of the switch (FET, described below) 220. In light of the following description of the remainder of the circuit of FIG. 2, those of ordinary skill in the art will understand that any suitable type of power supply arrangement can be employed as long as it is able to charge and regulate the energy storage capacitor 212 and is not damaged by any fast discharge of the capacitor 212.

A switching device (or "switch"), such as an FET 220 (compare 120) is connected, as shown, in series, between the laser diode (or array) 202 and ground, and is capable of connecting the load 202 to ground, in a controlled, intermittent manner. The line 221 connects one of the terminals (drain "D") of the switch 220 with the load 202, The other terminal (source "S") of the switch 220 may be connected to ground. The switch is described as an FET, but any device which can change impedance rapidly, in response to a trigger, may be utilized. A preferred device may be a Gallium Nitride (GaN) FET such as made by EPC Corporation. Silicon Carbide (SiC) FETs have a higher voltage capability than GaN, but are slower.

The switch may be any of a Gallium Nitride FET, a Silicon Carbide FET, a MOS FET, a BJT, a vacuum tube, a SCR, and any device that can change impedance rapidly in response to a trigger.

An external pulse source ("Input Pulse") 224 (compare 124) may be provided on an input line 225 to the gate "G" terminal of the FET 220, to control turning on/off of (i.e., current flowing through) the load 202.

A current pulse to (into, through) the laser diode 202 is initiated by turning on the switch 220 with the input pulse 224, typically applied to the gate G of a FET by a fast gate driver such as Texas Instruments UCC27611. The current builds up rapidly in the laser diode 204 and it's series parasitic inductor 206 due to the high voltage according to the well-known equation:

$$i_L = i_0 + \frac{1}{L}\int v \cdot dt$$

where:
$i_L$ is the current in the inductor
$i_0$ is the initial current in the inductor
L is the inductance in Henries
v is the time varying voltage across the inductor, and
t is time For a constant voltage across the inductor (206), this becomes: iL=v·t L $$i_L = \frac{v \cdot t}{L}$$

As an example, if the parasitic inductance 206 were 10 nH and the voltage (on line 211) were 200v, then the rise time of current to 100 amps would be 5 ns.

When the FET is turned off to terminate the flow of current from the capacitor, some current will remain flowing in the load's parasitic inductance. This generates a high voltage at the switch (FET) that is managed to avoid ringing and laser diode reverse damage, and to reduce the current draws from the energy storage capacitor by stopping or slowing down the rate of discharge of the energy storage capacitor.

The current pulse amplitude may be controlled or affected by any or some of: the time of the input pulse, the level of the input pulse, the voltage on the energy storage capacitor, and the current pulse amplitude is controlled by the power supply energy. The current pulse amplitude may also be controlled by sensing the discharged voltage of the storage element (capacitor) after the pulse and adjusting another control parameter. The current pulse amplitude may also be controlled by sensing the current flow through the load using a Hall effect sensor, a resistor in series with the current loop, the flyback voltage from the parasitic inductor, or a photo sensor looking at the light output of the LED or laser diode load. The current pulse amplitude may be controlled by a combination of any of the above methods.

A damping circuit (or network) 230 has an input 230a connected to the cathode terminal (K) of the laser diode 202, and has an output 230b connected to the high voltage line 211, and generally comprises at least two principal damping components: (i) a rectifying device such as a fast diode 232, and (ii) a damping device such as a resistor 234 connected in series with the fast diode 232. The resistor could be on either side of (i.e., either before or after) the diode. The damping circuit 230 provides for energy management (and, to some extent, recovery.)

The damping network may comprise some or all of resistors, diodes, inductors, active devices, and capacitors replacing or supplementing the fast diode and damping resistor.

Note that the terms "circuit" and "network" may be used, interchangeably, herein to refer to any interconnection of electrical components, irrespective of whether or not the components are interconnected in a closed path (or "circuit") that gives the return path for the flow of current.

The width of the input pulse 224 sets the peak current, along with other circuit parameters such as the regulated initial voltage on the capacitor 202, and the complex impedances in series with the current loop. For simplicity, additional stray inductances are not shown, but it is advisable that the layout be designed to minimize these to a very low level. It is desirable to minimize any impedance in the FET 220 source (S) lead to ground. The complexity of the damping circuit 230 required depends on these parasitic values. The peak current may also be limited by controlling the gate voltage of the switch FET 220. Lower gate voltages reduce current flow in the FET 220 in accordance with the gate voltage vs. drain current transfer characteristics.

Another method of regulation (not shown) may be to (i) measure the value of discharged voltage on the energy storage capacitor 212 just after the pulse, by means of a gated analog to digital converter; (ii) compare that with a desired voltage; and (iii) use the error signal to control another parameter such as the input pulse width for subsequent (following) pulses.

Alternatively, when a light emitting load is used, then the output light intensity may be measured with a photodiode (not shown) and this output may be used by comparing its value with a desired value, using the error signal to control the input pulse width 224 or other current-affecting parameter.

Another option (not shown) may be to use the value of the flyback type voltage generated at node (line) 221 when the FET 220 turns off. Higher currents produce a higher voltage with all other parameters being stable. This could be considered if the switch 220 voltage breakdown protection is a critical parameter.

In practice, a combination of the methods of regulation set forth herein may be preferred to stabilize the peak current and avoid the use of a sense resistor 122 shown in FIG. 1 or any other sense method that might increase the inductance of the energy discharge loop through the laser diode load 202, the energy storage capacitor 212, and the switch 220. Note especially that the position of the sense resistor 122 in FIG. 1 is especially compromising as any inductance here creates a voltage tending to subtract from the gate drive as the large Drain-Source current starts to flow.

At the termination of the input pulse 224, the switch 220 is shut off, but current remains flowing in the parasitic inductor 206 as current flow cannot suddenly stop when it is already flowing in an inductor. This high current, for example 100 amps, generates a positive voltage on the cathode K of the laser diode 204, rapidly flying positive to maintain the approximately 100 amps flow. This positive voltage causes a current to flow through the fast diode 232 and the damping resistor 234, back to the anode A of the diode load 202 and the high voltage line 211 (and energy storage capacitor 212), to reduce the current flow from the energy storage capacitor 212. The damping components (230) may be chosen such that the breakdown voltage of switch 220 is not exceeded, but the voltage should be as high as possible (near the breakdown voltage of FET switch 220) to discharge and dissipate or recover the stored energy quickly, such as in nanoseconds.

The two principal damping components of the damping circuit (or network) 230—namely, the fast diode 232 and the damping resistor 234—are shown separately for simplicity, as they constitute the dominant current flow path, after the switch 220 is open and current is trying to flow out of the inductor (206). In a practical implementation, other components, disposed both in series and in parallel with these two damping components, may be used as part of a network to cancel unwanted effects such as pulse ringing, reverse bias on the laser diode 204, excessive pulse width, and exceeding the voltage rating of the switch 220. These effects may be caused by parasitic elements of the circuit layout and components, and the compensation may be resistors, capacitors, inductors, or diodes in series, parallel or combinations in the current flow path or to ground; as represented by block 236. It may be noted that most of the dissipation of the stored energy of the parasitic inductor 206 is in the network 230, and residual current returned to the energy storage capacitor 212 will reduce (or cancel) the existing current flow to the laser diode load, thereby reducing energy loss. This method of energy recovery may be referred to as "energy discharge current cancellation".

Figure 2A:
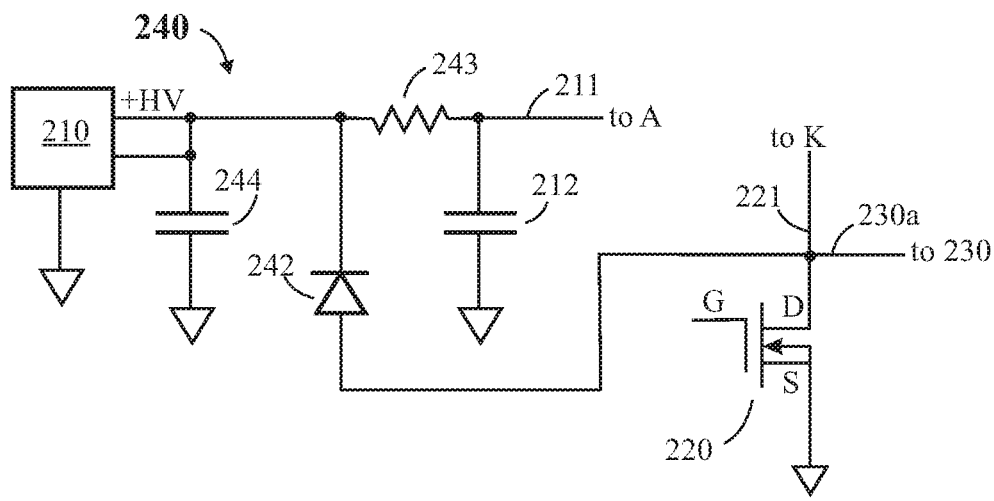
FIG. 2A is a schematic diagram of a protection circuit for the FET switch of the driver.

FIG. 2A shows a nuance that the FET (switching device) 220 may be additionally protected against overvoltage by a clamp diode 242 or active device to a high voltage reservoir. For example, if the energy storage (discharge) capacitor 212 is charged via a series "charging" resistor 243 from a fixed power supply at, for example, 180 volts, and the FET rating is 200V, then the damping and protection network 230 (see FIG. 2) may be extended to include this clamp to 180 volts, and consequently may have less damping to allow a faster flyback voltage without any damage risk. This technique may be applied to all of the embodiments described herein.

Consider, for example, that the HV power supply 210 operates at a fixed value, such as 180V. A charging resistor 243 is added between the fixed +HV output of the PSU 210 and the energy storage capacitor 212. When the energy storage capacitor 212 is discharged it is recharged to 180V exponentially via the charging resistor 243. An advantage to this arrangement is that the FET 220 drain is always safe as it is clamped to 180V. Any flyback energy is put back into the HV power supply so there is better efficiency from that, (in a manner akin to the technique described with respect to FIG. 4) but the resistor 243 dissipates power when recharging the capacitor 212.

FIGS. 2, 2A illustrates that the PSU 210 has (2) outputs—these are one +HV output (the upper one, as viewed) and one feedback line (the lower one, as viewed) to regulate the voltage. Typically, in the existing cases, the feedback is to limit the maximum energy storage capacitor voltage by shutting off the PSU. A filter capacitor 244 is shown with one terminal connected to the two PSU outputs, the other terminal connected to ground. In FIG. 2A, the feedback loop stabilizes the fixed output voltage (by matching the power supply energy to the energy drawn by the resistor 243 and load), for example at 180$v$, by feeding the value back to a resistor divider with a reference and an error amplifier to control the PSU as it well known in power supply design. See, for example, *Practical Feedback Loop Design Considerations for Switched Mode Power Supplies*, Hangseok Choi, Ph. D, Fairchild Semiconductor Power Seminar 2010-2011, 14 pp With the exemplary "protection circuit" 240 (clamp diode 242, charging resistor 243, filter capacitor 244) illustrated in FIG. 2A, the (flyback) diode 213 is optional. It may not be needed it is possible to clamp and return all the flyback energy to the PSU fixed voltage capacitor 244. However, there will be some losses in the series (charging) resistor 243 instead. The resistor losses are equal to the energy lost in the capacitor. Although this solution is simple, it cannot be more than 50% efficient.

Whereas the load 202 is separate from the current driver, per se, the switch 220 and the damping circuit (or network) 230 may be considered, along with the capacitor 212, to be part of the overall current driver 200. In other words, in the various embodiments disclosed herein, everything except the load may be considered to be part of the current driver. Means for generating the input pulse may preferably be included in the current driver, or may be external thereto.

The energy storage capacitor 212 is normally partly discharged after the pulse, as this helps with the pulse shape and provides an energy limit for the laser diode 204, but it is not desirable for the capacitor 212 to discharge below zero due to capacitive inductive voltage ringing (resonances) as reverse laser diode 204 current may flow. The value of the capacitor 212 may be selected to avoid this.

The energy storage capacitor 212 is typically designed to partially discharge, thereby helping to shape and define the pulse through the laser diode 204, but it should be clear to those skilled in the art that this is not essential, as the pulse width is defined by the input pulse. It should also be apparent that the energy storage capacitor 212 may be replaced by a pulse-forming network, typically comprising multiple capacitors and inductors to modify the pulse shape. See, e.g., https://en.wikipedia.org/wiki/Pulse_forming_network, incorporated by reference herein). The laser diode parasitic inductance (206,) may be part of that network. This description generally applies to the other embodiments and is not repeated for clarity.

The protection (shunt) diode 108 (FIG. 1) is omitted in this embodiment to allow the parasitic inductance 206 of the laser diode to discharge quickly into a desired high voltage load as exemplified by the combination of damping network, current feedback into the storage capacitor, or recovered energy; but at a voltage less than the FET breakdown voltage.

Some of the elements and concepts described with respect to the FIG. 2 embodiment may be carried forward into the following (FIG. 3, et seq.) embodiments, and therefore may be described only briefly. And, other nuances not previously discussed may be described.

Figure 3:
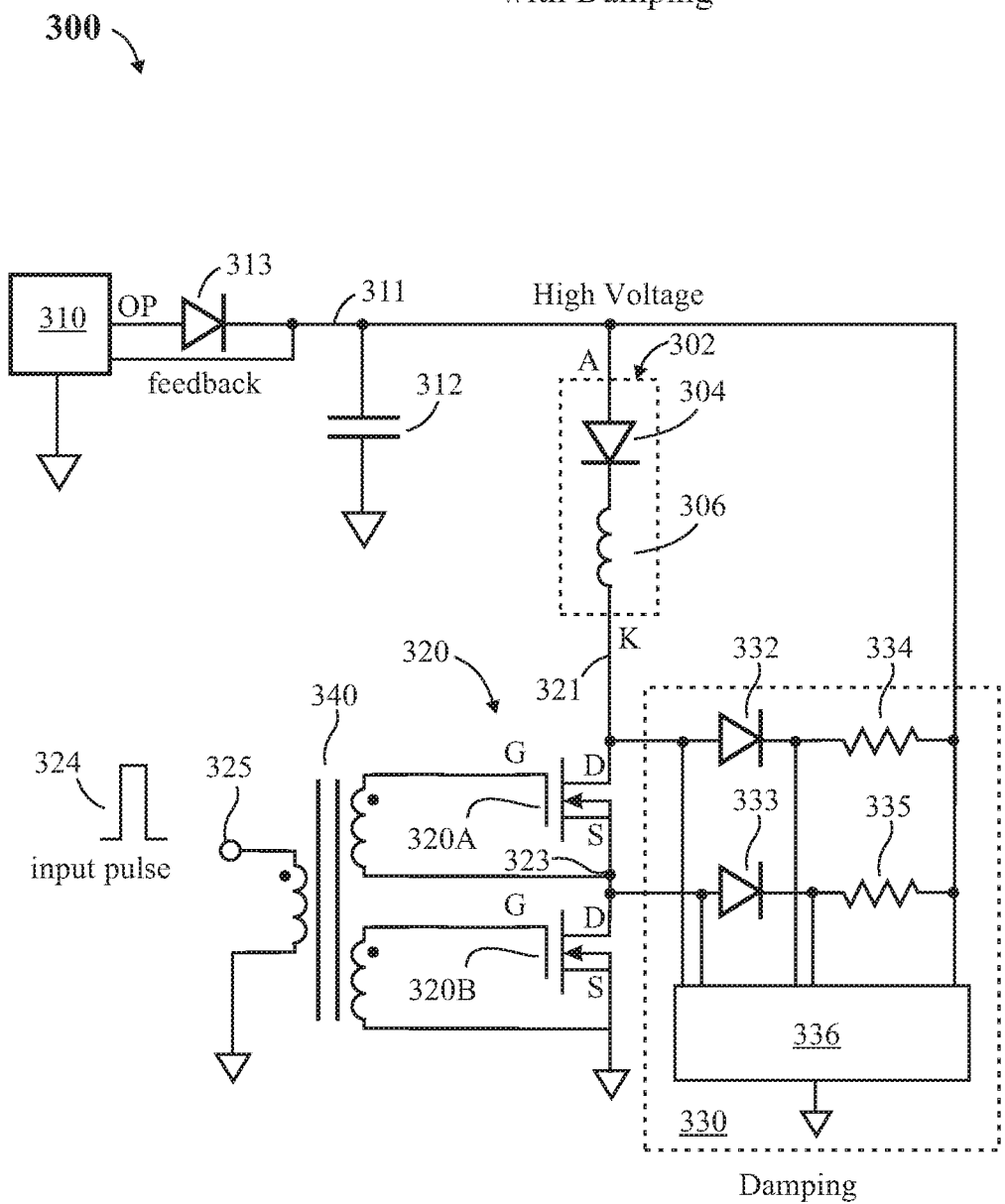
FIG. 3 is a schematic diagram of fast high-voltage current driver, with damping, according to an embodiment of the invention.

FIG. 3 shows a variation (another embodiment) of a pulsed current driver 300 which may provide higher current and/or faster rise and fall times than may be available with the driver 200 of FIG. 2. Some principles discussed here may apply as well to the FIG. 2 embodiment, and vice-versa.

Generally, the current driver 300 receives an input pulse 324 (compare 224) on a line 325 (compare 225), and drives a current-driven load or device 302 (compare 202), such as a light emitting diode (LEDs) or a laser diode, or arrays thereof.

The load may a laser diode 302 (compare 202) comprising the diode itself 304 (compare 204) and a parasitic inductance 306 (compare 206). The anode of the laser diode is labeled "A", the cathode of the laser diode is labeled "K". The load may comprise an array of laser diodes. It should be understood, that the laser diode (and its parasitic inductance) do not form a part of the current driver, per se, but there may be other parasitic resistive, inductive and capacitive values in the driver not shown in the FIGS. for clarity. Part of the function of the damping network is to manage or cancel effects due to these values.

The current driver 300 may comprise a power source 310 (compare 210) having an output "OP" on a line 311 (compare 111) for charging an energy storage capacitor 312 (compare 212) to a voltage which is much higher that the laser diode operating voltage. This is similar to the FIG. 2 embodiment, and may use the technique of a flyback power supply with a diode 313 (compare 213).

In this embodiment, the switching device 320 capable of connecting the current-driven load to ground in a controlled, intermittent manner comprises two switches, such as an FET 320A (compare 220) and an FET 320B (compare 220) which are connected, as shown, in series, between the cathode (K) of the laser diode 302 (line 221) and ground. The connection (or line) between the two FETs (i.e., between the source "S" of the FET 320A and the drain "D" of the FET 320B) is labeled 323. This series switch (FET) circuit (320, comprising 320A and 320B) may be expanded by adding more FETs in series (and corresponding damping circuits as, described below).

It should be understood that the switching devices are described as FETs, but any device (electrical component or combination of components) which can change impedance rapidly may be utilized.

A current pulse to the laser diode 304 is initiated by simultaneously turning on the switches 320A and 320B with the input pulse 324.

GaN FETs are currently limited in voltage to 100 or 200 volts, and if the energy storage initial voltage can be doubled, then the current pulse rise and fall time may be reduced by 50%. In addition, greater currents into arrays of series laser diodes with a higher required drive voltage may be achieved. The two switches 320A and 320B are shown connected in series, and the damping circuit 330 (compare 230) is expanded (doubled) to protect both FETs and return some current to the high voltage line 311 (and energy storage capacitor 312).

In this embodiment, the damping circuit 330 (compare 230) comprises two damping networks. A first damping network (or current flow circuit) comprises a fast diode 332 (compare 232) and a damping resistor 334 (compare 234), and is connected to the FET 320A, as shown. A second damping network (or current flow circuit) comprises a fast diode 333 (compare 232) and a damping resistor 335 (compare 234), and is connected to the FET 320B, as shown.

In this embodiment, the damping circuit 330 (compare 230) has two inputs, one input (or the input of one of the two diode/resistor networks) connected with the cathode (K) of the laser diode 302, the other input (or the input of the other of the two diode/resistor networks) connected to the junction of the two FETs. (Since they operate in unison with one another, the two inputs to the damping circuit 330 may be considered to be one input—compare the one input 230a in FIG. 2.) The network 336 manages any additional damping needed to protect both FETS 320A and 320B when they turn off. Both of the diode/resistor networks are connected back to the high voltage line 311. (Compare the output 230b of the damping circuit 230 in FIG. 2.)

As discussed above, effects may be caused by parasitic elements of the circuit layout and components, and damping compensation may be provided by resistors, capacitors, inductors, active devices, or diodes in series, parallel or combinations in both current flow paths to the high voltage line 311 or to ground; as represented by block 336 (compare 236).

The damping networks are connected, as shown, to protect the FETs and the laser diode 304 from damage as well as reducing the discharge of some stored energy from the capacitor 312, as discussed with respect to the embodiment of FIG. 2 (driver 200) above.

An external pulse source ("Input Pulse") 324 (compare 224) may be provided to the gate "G" terminals of the FETs 320A and 320B via a pulse transformer 340. For the best balance and matching of turn-on times (of the two FETs), the pulse transformer may comprise a single primary winding, and a single core with multiple secondary windings corresponding with the number (in this example, two) of FETs. In this example, two secondary (or gate) windings are shown. Generally, each of the secondary (gate) windings is connected with the gate (G) of a respective one of the FETs, and can jump half the HV as the input pulse switches so stray capacitances must be kept low. The pulse transformer 340 receives the input pulse 324 at its primary winding, and the secondary windings control the turning on (and off) of the FETs, in response to the input pulse. The pulse transformer 340 can be very fast, and can isolate and drive a lot of gate pulse current. It should be understood that, although the increasing FET leakage close to breakdown may accomplish voltage balance across each FET, a high-value resistor (not shown, such as 100 k ohms) may be added across each FET to equalize the drain-source voltages in the off or stand-by state. (A pulse transformer may also be used in the single FET embodiment of FIG. 2.)

The protection (shunt) diode 108 (FIG. 1) is omitted in this embodiment to allow the parasitic inductance 306 of the laser diode to discharge quickly the high voltage input load of the damping circuit and then residually back to the energy storage capacitor 312.

Simulations show that currents of 200 amps may be generated with a pulse width of 10 nanoseconds. The simulation is of particular value to determine if the internal junction between the laser diode (204, 304) and the parasitic inductance (206, 306) is reverse biasing the laser diode (204, 304) as this can cause damage. The circuit inductances may be measured on a high frequency network analyzer, and software is available to design the layout taking account of the circuit inductances. It is important to minimize the inductances both of the laser diode connections and driving circuitry by known high frequency techniques such as using paralleled components, short wide traces, and multiple parallel diode bonds or paths if applicable, as well as cancellation by layout of the current-caused electrical fields. Tools to set these parameters and the compensation network are the simulation software and a network analyzer.

Figure 5:
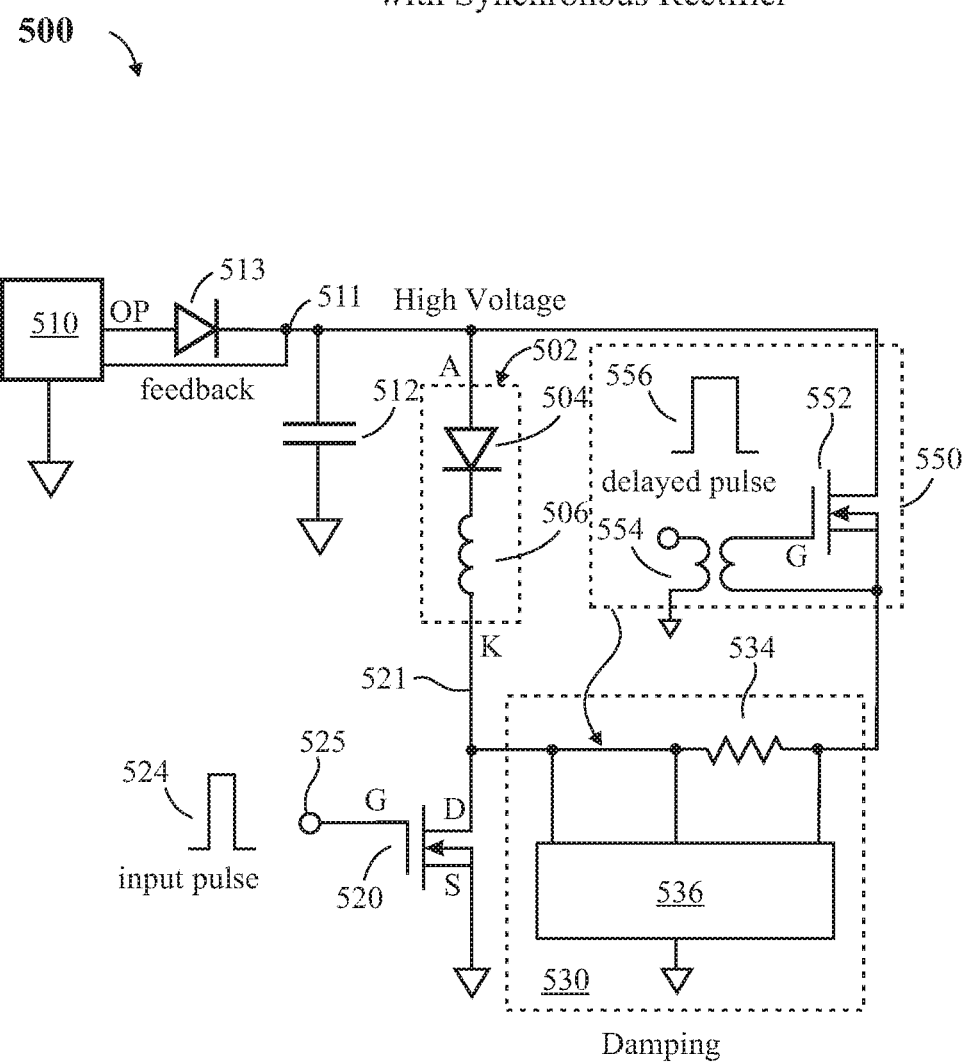
FIG. 5 is a schematic diagram of a fast high-voltage current driver, with damping, showing an optional replacement of the energy management and recovery diode by a fast synchronous rectifier.

FIGS. 2, 3 and 5 illustrate some techniques of damping, and energy discharge current cancellation.

Figure 4:
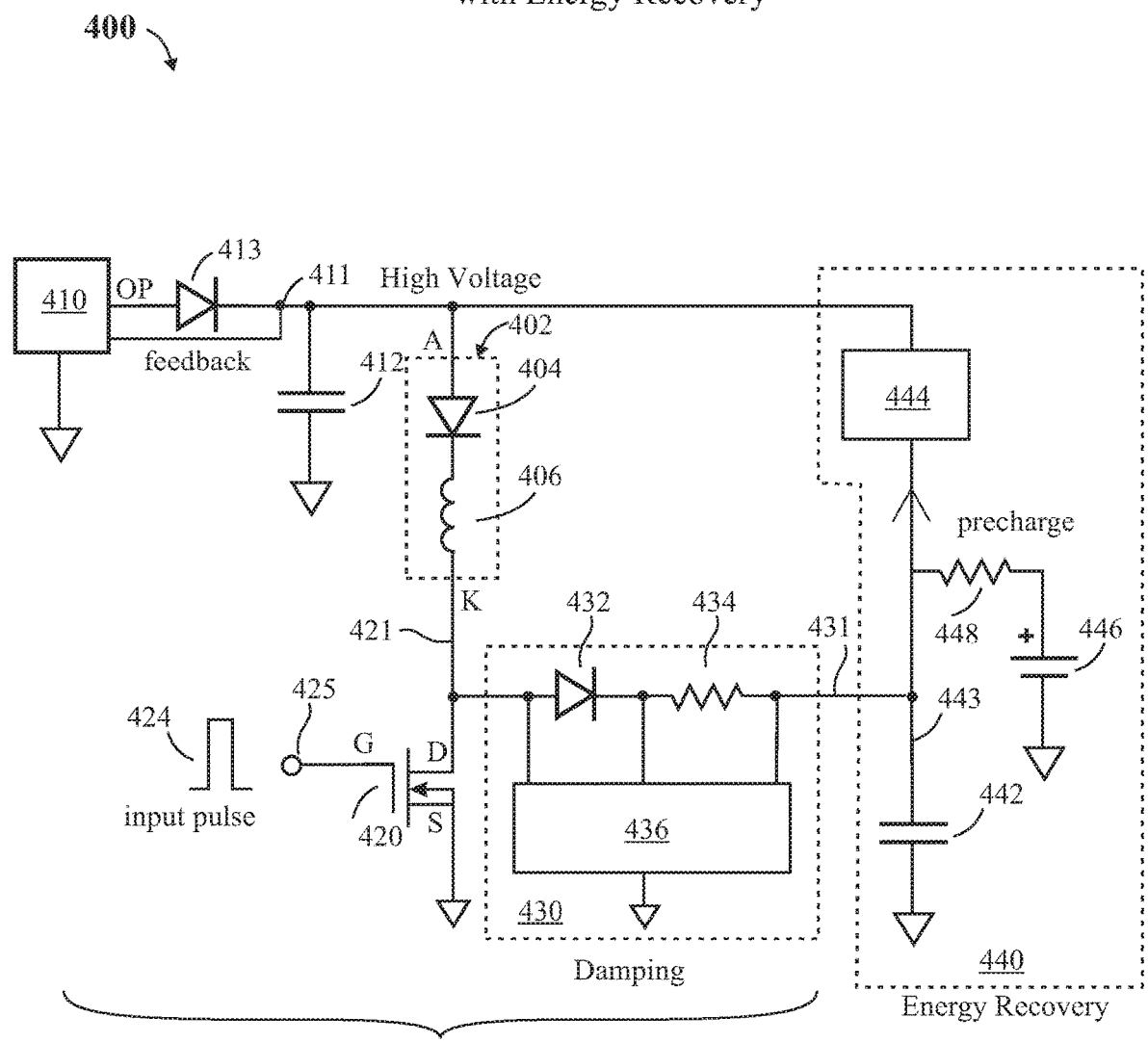
FIG. 4 is a schematic diagram of a fast high-voltage current driver, with damping, showing also a method of energy recovery to a fixed voltage reservoir (or capacitor), according to an embodiment of the invention.
Figure 6:
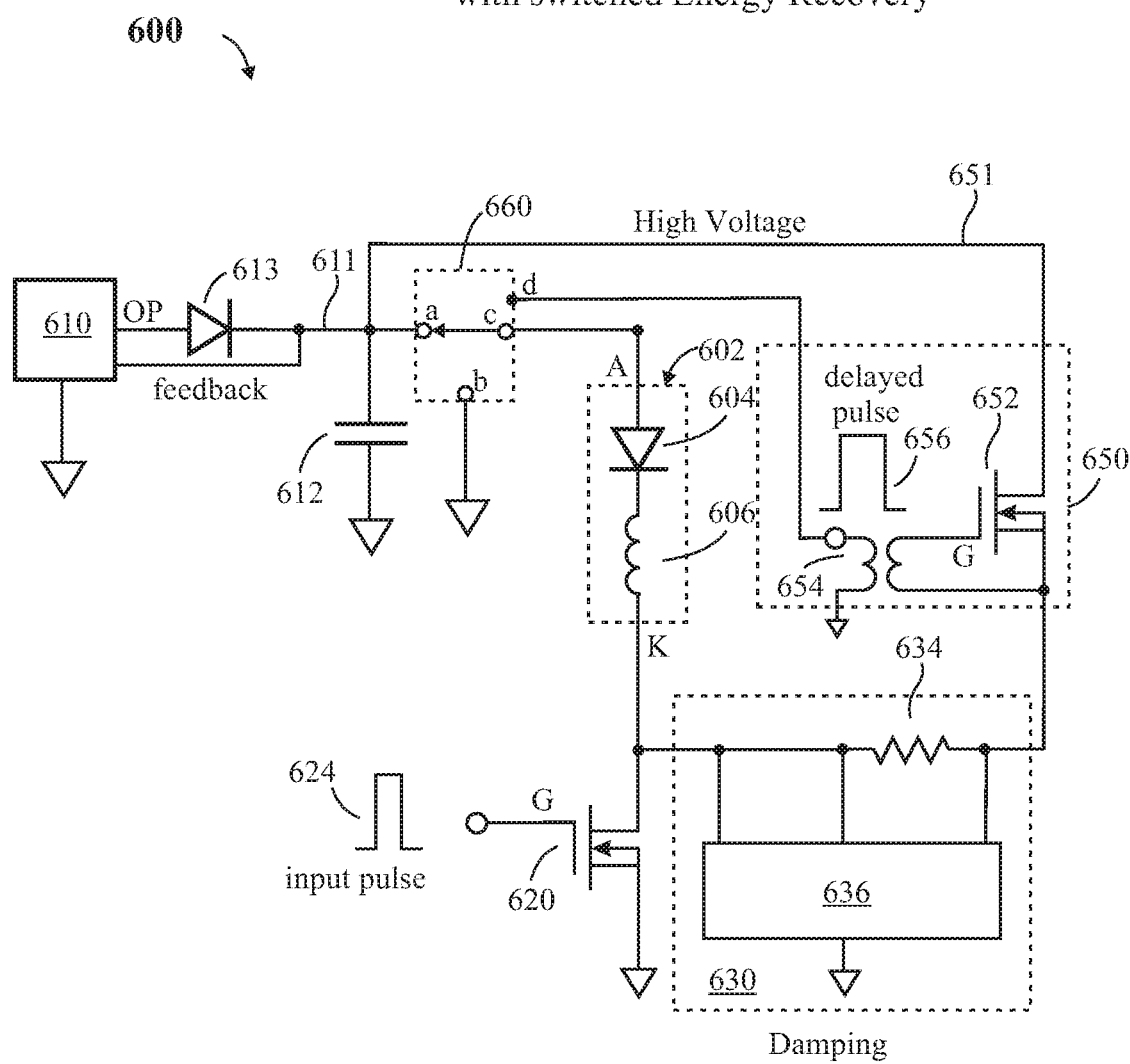
FIG. 6 is a schematic diagram of a variation of the energy recovery current driver 400, with a switch added to disconnect the load from the power and reconnected to ground to allow a more efficient recovery of stored energy, according to an embodiment of the invention.

FIGS. 4 and 6 illustrate some techniques of damping, and energy recovery methods which may be more efficient than the energy discharge current cancellation techniques of FIGS. 2, 3 and 5. As an example, a 200 amp current flowing in a laser diode array with 10 nH of inductance at a repetition frequency of 1 Mhz causes a stored energy of 200 uJ for a total power of 200 watts to be stored in the inductor. This has to stress parts or be dissipated somewhere if energy recovery or turn off strategies are not considered. This effect is especially important as currents are increased because the energy stored in the load inductance is proportional to the current squared, ($0.5 L i^2$).

FIG. 4 is a schematic diagram of an embodiment of a pulsed current driver 400 of the present invention. with a more flexible energy recovery option (than was described hereinabove). Generally, this may be considered to be an "add-on" to the embodiment 200 of FIG. 2. Common elements (202, 204, 206, 210, 212, 220, 221, 224, 225, 230, 232, 234) may be similarly numbered (402, 404, 406, 410, 412, 420, 421, 424, 425, 430, 432, 434).

Briefly, current driver 400 (compare 200) may comprise a power source 410 (compare 210) having an output "OP" on a line 411 (compare 211) for charging an energy storage capacitor 412 (compare 212), and may use the technique of a flyback power supply with a diode 413 (compare 213). The load may be a laser diode 402 (compare 202) comprising the diode itself 404 (compare 204) and a parasitic inductance 406 (compare 206).

A switching device, such as an FET 420 (compare 220) may be connected between the laser diode 402 and ground, and is capable of connecting the load 402 to ground, in a controlled, intermittent manner. The line 421 connecting the switch 420 with the load 402 may be considered to be one of the terminals (D) of the switch.

An external pulse source ("Input Pulse") 424 (compare 224) may be provided on a line 425 (compare 225) to the gate "G" terminal of the FET 420. The drain "D" terminal of the FET 420 may be connected to the load 402 via the line 421. The source "S" terminal of the FET 420 may be connected to ground.

A damping circuit 430 (compare 230) is connected between the line 421 (cathode K of the laser diode) and ground, and is connected to the high voltage line 411 and capacitor 412 via an Energy Recovery block 440 (described hereinbelow).

The damping circuit 430 may comprise a (network comprising a) fast diode 432 (compare 232) and a damping resistor 434 (compare 234), as well as other parasitic elements of the circuit layout as represented by block 436 (compare 236). Two, or more FETs and extended (additional) damping networks may be connected with two or more FETs (compare FIG. 3).

Energy recovery may be secondary to (less important than) obtaining a fast smooth high peak-current pulse, but the laser diode parasitic inductance may be viewed as a flyback inductor working in association with the switch 420 (compare 220). When the switch 420 turns off, the drain D voltage flies positive and that current may be used through the diode 432 and damping resistor 434 to partly cancel the current from the energy storage capacitor 412 (212, 312) as shown in FIG. 2 and FIG. 3. This "cancelling" operation does not "recover" the energy used, but helps stop the energy storage capacitor 412 from further discharging (after supplying the peak pulse to the laser diode).

In addition to the damping function provided by the damping circuit 436 (also damping circuits 236 and 336 in FIGS. 2 and 3, respectively), a separate energy recovery circuit 440 is shown in FIG. 4.

The energy recovery circuit 440 shown in FIG. 4 comprises a capacitor 442 and a buck (step-down) or boost (step-up) converter 444, and may further comprise a low-power voltage source 446 and associated resistor 448, connected as shown. The capacitor 442 may be referred to as an "energy storage capacitor".

The buck or boost converter 444 maintains a voltage of the capacitor 442 between an upper and lower limit, and may transfer spare energy to another load, such as to the capacitor 412.

In FIGS. 2 and 3, the damping circuit (230, 330) is connected directly to the high voltage line (211, 311). In FIG. 4, the output of the damping circuit 430 (on line 431) is connected via the converter 444 to the high voltage line 411.

With the energy recovery circuit 440, better energy recovery of the stored energy in inductance 406 may be achieved by charging a separate capacitor 442 (which may be considered to be a second energy storage capacitor, compare 412, and which also may be considered to be a fixed voltage reservoir) set at an optimum desired flyback voltage for a fast current decay and efficiency. This voltage is typically more than the discharged value of capacitor 412 at the end of the input pulse, and yet not so high as to break down the FET switch 420 in the "off" condition. Consequently, the damping resistor 434 may be of a lower value (than 234 or 334). Also, in this energy recovery embodiment (FIG. 4), the damping may be less (need not be as great), as compared with the other embodiments (FIGS. 2,3), as the high voltage load for turn off clamping is the pre-charged capacitor 442—with correspondingly less voltage and power loss across the damping components.

Energy stored in the capacitor 442 may be recovered conventionally by a buck or boost converter 444 to be reused as a power source, or to recharge the energy storage capacitor 412. A boost converter may be preferred to convert the high voltage on the storage capacitor 442 to a higher value to help recharge the energy storage capacitor 412. The converter 444 is shown connected between the high voltage line 411 (capacitor 412) and the secondary energy storage capacitor 442. The converter 444 could alternately be used to power an external load (not shown). A line 443 connects the capacitor 442 to the converter 444, and is also connected to the output (line 431) of the damping circuit 430.

The operation of the converter 444 may be controlled by conventional regulating means (not shown) when the voltage on the capacitor 442 increases above a threshold, and the amount of energy from power supply 410 may be reduced accordingly so that the voltage on the high voltage line 411 may be regulated at the optimum value.

The capacitor 442 may be pre-charged to a high voltage by a low-power voltage source 446 so that the first pulse turn-off switch voltage spikes up to the voltage desired limit and the current pulse has a fast fall time as the stored energy in the laser diode parasitic inductance is quickly removed. Pre-charging the capacitor 442 avoids a waiting period of a number of pulses required to pump (charge up) the storage capacitor 442 to the correct voltage value for fast turn off, before the correct waveforms of the fast pulse are created. The low-power voltage source 446 may be connected via an appropriate resistor 448 to the second energy storage capacitor 442, as shown. The energy recovered in the capacitor 442 can be utilized for any purpose, for example powering a buck converter to operate low voltage circuits. Generally, the extra complexity of the energy recovery circuit 440 would be justified in high-repetition and high-current drivers using substantial power, or in a diode array exhibiting larger values of inductance 406.

Synchronous Rectifier Option

FIG. 5 is a schematic diagram of an embodiment of a pulsed current driver 500 of the present invention, using a synchronous rectifier circuit 550 rather than a fast diode (compare 232) in the damping circuit 530 (compare 230) and is shown using one FET 520 (compare 220) switch. As described below, the synchronous rectifier circuit 550 may be located within the damping circuit 530.

Generally, the synchronous rectifier 550 operates in response to delayed pulse 556 provided on an input of the synchronous rectifier. More details of the delayed pulse are set forth hereinbelow. The input of the synchronous rectifier is represented by the circle on the primary winding of a pulse transformer 554, described in greater detail hereinbelow.

In FIG. 5, briefly, current driver 500 (compare 200) may comprise a power source 510 (compare 210) having an output "OP" on a line 511 (compare 211) for charging an energy storage capacitor 512 (compare 212), and may use the technique of a flyback power supply with a diode 513 (compare 213). The load may be a laser diode 502 (compare 202) comprising the diode itself 504 (compare 204) and a parasitic inductance 506 (compare 206). A switching device, such as an FET 520 (compare 220) may be connected on a line 521 between the laser diode 502 and ground. An external pulse source ("Input Pulse") 524 (compare 224) may be provided on a line 525 to the gate "G" terminal of the FET 520.

A damping circuit 530 may comprise a resistor 534 (compare 234) as well as other parasitic elements of the circuit layout as represented by block 536 (compare 236). These elements may be distributed around, in series with (as shown), or in parallel with a synchronous rectifier block 550 as may be necessary to damp or cancel the effects of parasitic elements of a practical circuit layout. The fast diode (232) is omitted from this embodiment.

Shown outside of the damping circuit 530 for illustrative clarity, the synchronous rectifier block 550 could be located within the damping circuit, where the fast diode (232) was located (FIG. 2), and should be connected in series with the damping resistor 534. This alternative is indicated by the curved arrow between the synchronous rectifier block 550 and the damping circuit 530.

The synchronous rectifier block 550 uses an FET 552 as the active (switching) element controlled by a delayed pulse 556 via a pulse transformer 554. Very fast diodes capable of nanosecond turn on to high currents are only just becoming available and the use of a faster, preferably gallium nitride FET may provide better clamping.

The delayed pulse 556 may be delayed (starts after) the input pulse 524, and may have a longer duration than the input pulse 524. (Although the synchronous rectifier ON time may usually be longer than the input pulse, it is not necessarily so.) Small timing variations in the delayed pulse 556 may be advantageous in optimizing the damping and clamping of the FET 520 flyback voltage. The delayed pulse 556 may turn on the FET 552 approximately at the time the input pulse 524 shuts off (and FET 520 turns off). The FET switch 552 may be in series with damping resistor 534 (compare 234) on either the High Voltage line 511 side or on the FET switch 520 side of the damping resistor 534. The FET switch 552 is shown on the High Voltage side in FIG. 5, but in either case the basic operation is the same. In this embodiment (FIG. 5), the FET 552 is substituted for the fast diode (232)—both may be considered to be "rectifying devices".

The FET switch 552 operates in conjunction with the damping network 530 to damp the high voltage transient and provides current into the high voltage line 511, thus reducing the discharge of the energy storage capacitor 512 as the energy flowing in the laser diode 504 and parasitic inductor 506 decays. The FET 552 may be a GaN type with a very fast turn-on, and the actual timing of the delayed pulse 556 may be controlled so that the turn on of the FET 552 allows the damping to be optimized.

The width of the delayed pulse 556 should be sufficiently long to allow all of the stored energy from parasitic inductor 506 to dissipate (and be at least partially reclaimed/harvested), and generally it will be wider than the input pulse 524.

The synchronous FET switch 550 is an option that may be used in place of (or as a substitute for) the diode 232 (as well as 332, 333, and 432), and may be incorporated into the damping network 530 (as well as 230, 330, 430) without adversely affecting the basic operation of the invention. The FET switch 550 is basically a more efficient diode which can be used until GaN diodes are available, and can be disposed before or after the damping resistor 534, in series therewith.

Efficient Energy Recovery Method

FIG. 6 shows an embodiment with switched (or gated) energy recovery. Recall that energy recovery was discussed with regard to FIG. 4. Recall also that a rectifier for the damping circuit (230, 330, 430, 530) damping may comprise a fast diode (232, 332, 333, 432) or, alternatively, a synchronous rectifier circuit (550). This embodiment (FIG. 6) will be described as an add-on to the synchronous rectifier embodiment (FIG. 5), since it may use the same timing signal (delayed pulse 556), but it should be understood that the switched energy recovery described herein (FIG. 6) could be done using a fast diode (232) and a separate timing signal.

In this (FIG. 6) embodiment, the delayed pulse controlling switching may start after the input pulse (in the manner of the delayed pulse 556), but need not have a duration longer than the input pulse (624), and may terminate substantially simultaneously therewith.

Briefly, current driver 600 (compare 500) may comprise a power source 610 (compare 510) having an output "OP" on a high voltage line 611 (compare 511) for charging an energy storage capacitor 612 (compare 512), and may use the technique of a flyback power supply with a diode 613 (compare 513). The load may be a laser diode 602 (compare 502) comprising the diode itself 604 (compare 504) and a parasitic inductance 606 (compare 506). A switch, such as an FET 620 (compare 520) may be connected between the laser diode 602 and ground. An external pulse source ("Input Pulse") 624 (compare 524) may be provided to the gate "G" terminal of the FET 620. A damping circuit 630 (compare 530) may comprise a damping resistor 634 (compare 534), as well as other parasitic elements of the circuit layout as represented by block 636 (compare 536). The fast diode (432) is omitted from this embodiment.

A synchronous rectifier circuit 650 (compare 550) is used instead of a fast diode (232) and is shown in series with the damping resistor 634 (compare 534) on the high voltage side of the damping circuit 630 (compare 530). The synchronous rectifier block 650 uses an FET 652 (compare 552) as the active (switching) element controlled by a delayed pulse 656 (compare 556) via a pulse transformer 654 (compare 554). The delayed pulse 656 may be delayed (starts after) the input pulse 524, and may have a longer duration than the input pulse 524.

The FET switch 652 operates in conjunction with the damping network 630 to damp the high voltage transient and provides current into the high voltage line 611, thus reducing the discharge of the energy storage capacitor 612 as the energy flowing in the laser diode 604 and parasitic inductor 606 decays.

The embodiment 600 of FIG. 6 may be especially useful when the value of the load's parasitic inductance 606 is high and it is desired to recover the maximum amount of stored energy in the parasitic inductance 606, for example, when operating at high repetition rates at high currents with a series connection (array) of laser diodes.

In the embodiment 600 of FIG. 6, a switch 660, which is essentially a single-pole double-throw (SPDT) switch, is disposed in the high voltage line 611, as follows.

one throw terminal ("a", or $V_{in}$) of the switch is connected to the output of the power source 610 (capacitor 612 and flyback diode 613). Recovered energy from the damping circuit 630 is provided on the line 651 to the capacitor 612, as described hereinabove, whether directly (FIG. 2) or via a synchronous rectifier (FIG. 5).

a second throw terminal ("b", or $P_{gnd}$) of the switch is connected to ground.

the pole ("c", or $V_{sw}$) of the switch is connected to the anode (A) of the laser diode 602 load.

the switch 660 receives a pulse, which may be the delayed pulse 656 (compare 556) used for the synchronous rectifier circuit 650.

The switch 660 may include a half bridge FET module such as made by EPC: http://epc-co.com/epc/Products/eGaNFETsandICs/enhancementmodemonolithichalf-bridge.aspx.

Because the switch 660 is a monolithic die, the stray inductances are very low. The high side half bridge FET is normally held on ("a" is connected with "c", as shown represented in FIG. 6), connecting the high voltage line (power) 611 to laser diode 602 anode A, ready to fire the laser. And, the input pulse 624 turns on the FET switch 620 to fire the laser.

Next, when the delayed pulse 656 rises at the end of the pulse 624 and the FET switch 620 turns off, the switch 660 rapidly switches the anode A of the laser 602 to ground. If a synchronous rectifier 650 is used in place of the diode (232), as shown, it is also simultaneously turned on so that the stored energy in parasitic inductance 606 is recovered, preferably to recharge the energy storage capacitor 612 as shown in FIG. 6.

Details of driving a half bridge switch (such as 660) are omitted, for clarity, as this is well documented in the art of power supply design. Generally, the switch 660 is operable to alternately connect the first terminal (A) of the load 602 to the high voltage line 611 and ground, in response to the delayed pulse 656—or, switch the terminal (A) of the load 602 between the high voltage line 611 and ground.

The switched (or gated) energy recovery technique described with respect to FIG. 6 may provide for faster fall time and better energy recovery, irrespective of the type of rectifying device (fast diode 232 or synchronous rectifier 550) used. By switching the anode A of the laser diode from the capacitor (a) to ground (b) after the pulse is done, the current residual flowing in the laser diode 602 and inductor 606 is referenced to ground. All of the energy stored in the inductor 606 will thus be available for energy recovery. At the same time, that current flow is not taken from the power source, and capacitor 612 stops discharging (because it is disconnected from the load). (Otherwise, if the laser diode load were still connected to the power source, then the inductor decaying current has to continue to flow from that power source, thus using energy).

When the main pulse 624 is finished, the two functions take place at the same time. Either a diode or a synchronous rectifier turns on as the FET is turned off to divert the load inductor current back to the power line or to a storage element. Simultaneously, it is desirable for that current to flow for a short time, so the source of current is switched by the signal at (d) from +power (a) to ground (b), thus increasing the potential that the inductor 606 has to drive and therefore shortening the discharge time. There could be nanoseconds variation in switching times to optimize transient management, but basically the power switch and synchronous rectifier (if used) are co-incident with the main FET turning off.

To summarize, the previously described energy recovery circuits are limited by the need not to exceed the FET breakdown voltage and the requirement for a fast laser diode turn off to reduce the energy used after the peak current (and peak light power) is achieved. The goal is to reduce the laser diode current as rapidly as possible. It is simplest to recharge the energy storage capacitor 612 with any unused energy, but because the laser diode block is being fed from capacitor 612, the best that can be done in the FIG. 2 and FIG. 3 embodiments is to recycle the current back to cancel the unstoppable flow from the energy storage capacitor 212 into inductor 606. At the end of the input pulse when FET 620 turns off, the drain voltage (K) flies up. If at the same time we were to re-reference the anode of the laser diode to ground using a switch controlled by delayed pulse 656, all the inductor 606 flyback current could flow back into energy storage capacitor 612 with the greatest possible voltage across inductor 606 and therefore the shortest turn off time. Note that the laser diode 604 is turned on at this time due to the existing current flow and is essentially a short circuit with respect to the inductor 606 current. It is convenient to turn on FET 650 as a synchronous rectifier using the same delayed pulse 656. The energy stored in the inductor 606 flows through FET 650 to partially recharge energy storage capacitor 612.

It should be understood by those of ordinary skill in the art the techniques shown and described hereinabove can readily be adapted to use laser diode or light emitting diode arrays as the load. The high stored voltage source makes changes in the diode operating voltage less critical.

Whereas current flows in a loop from a positive source in these examples, it is understood that the polarity of power and the order and polarity of components in the loop may be altered without diverting from the spirit and scope of the invention.

While the invention has been described with respect to a limited number of embodiments, these should not be construed as limitations on the scope of the invention, but rather as examples of some of the embodiments. Those skilled in the art may envision other possible variations, modifications, and implementations that are also within the scope of the invention, based on the disclosure(s) set forth herein.

What is claimed is:

1. A pulsed current driver for driving a current-driven load, comprising:
    a power source providing, in use, an output on a high voltage line to a first terminal of a current-driven load, wherein the current-driven load has a parasitic inductance and a second terminal;
    an energy storage capacitor connected between the high voltage line and ground;
    a switching device capable of connecting the second terminal of the current-driven load to ground in a controlled, intermittent manner; and
    an input line capable of providing an input pulse to the switching device;
    further comprising:
    a damping circuit having an input connected to the second terminal of the current-driven load and an output connected to the high voltage line, wherein the damping circuit comprises a rectifying device and a damping device connected in series with the rectifying device;
    further comprising:
    a switch for alternately connecting the first terminal of the load to the high voltage line and ground, in response to a delayed pulse;
    wherein the delayed pulse starts after the input pulse.

2. The pulsed current driver of claim 1, wherein:
    the rectifying device is selected from the group consisting of fast diode and synchronous rectifier.

3. The pulsed current driver of claim 1, wherein the current-driven load is selected from the group consisting of light emitting diode (LED), laser diode, and an array of diodes.

4. The pulsed current driver of claim 1, wherein the switching device comprises at least one electrical component which can change impedance rapidly.

5. The pulsed current driver of claim 1, wherein the switching device comprises at least two electrical components connected in series with one another.

6. The pulsed current driver of claim 1, wherein the switching device comprises at least one electrical component selected from the group consisting of FET, Gallium Nitride (GaN) FET, and Silicon Carbide (SiC) FET.

7. The pulsed current driver of claim 6, further comprising:
    a pulse transformer receiving the input pulse at a primary winding thereof, and having a number of secondary (gate) windings corresponding to the number of electrical components of the switching device, wherein the secondary windings control the turning on (and off) of the electrical components of the switching device, in response to the input pulse.

8. The pulsed current driver of claim 1, further comprising:
    an energy recovery circuit connected between the output of the damping circuit and the high voltage line, the energy recovery circuit comprising a second energy storage capacitor.

9. The pulsed current driver of claim 8, further comprising:
    a buck or boost converter connected between the second energy storage capacitor and the high voltage line or powering an external load.

10. The pulsed current driver of claim 8, further comprising:
    a low power voltage source connected to the second energy storage capacitor.

11. The pulsed current driver of claim 1, wherein:
    the rectifying device comprises a synchronous rectifier operating in response to a delayed pulse provided to an input of the synchronous rectifier;
    wherein the delayed pulse starts after the input pulse.

12. The pulsed current driver of claim 1, wherein:
    the energy storage capacitor is replaced with a pulse forming network.

13. The pulsed current driver of claim 1, wherein:
    the switching device comprises an FET switch; and
    further comprising:
    a filter capacitor connected to the power source output;
    a clamp diode connected between the FET switch and the power source output; and
    a charging resistor between the power source output and the energy storage capacitor.

14. A method for driving an LED or laser diode load with a current pulse, wherein the load has a parasitic inductance, comprising:
    with a power supply, providing a high voltage on a high voltage line;
    connecting an energy storage capacitor to the high voltage line;
    connecting a first terminal of the load to the high voltage line;
    in response to an input pulse, with a switching device, intermittently connecting a second terminal of the load to ground; and
    providing a damping circuit between the second terminal of the load and the high voltage line;
    further comprising:
    switching the first terminal of the load between the high voltage line and ground, in response to a delayed pulse;
    wherein the delayed pulse starts after the input pulse.

15. The method of claim 14, wherein:
    the damping circuit returns residual current to the energy storage capacitor to reduce (or cancel) current flow to the laser diode load, thereby reducing energy loss.

16. The method of claim 14, further comprising:
    connecting an energy recovery circuit between the damping circuit and the high voltage line.

17. The method of claim 16, wherein:
    the energy recovery circuit comprises a second energy storage capacitor and a buck or boost converter connected between the second energy storage capacitor and the high voltage line or an external load; and
    further comprising:
    controlling operation of the converter by conventional regulating means when the voltage on the capacitor increases above a threshold; and
    if necessary, reducing the amount of energy from the power supply accordingly so that the voltage on the high voltage line may be regulated at an optimum value.

18. The method of claim 14, wherein the switching device comprises at least one FET, and further comprising:
    choosing components of the damping circuit such that a breakdown voltage of the FET is not exceeded, with the voltage being as high as possible (near the breakdown voltage of the FET) to discharge and dissipate or recover quickly energy stored in a parasitic inductance of the load.

19. The method of claim 14, wherein a current pulse amplitude is controlled by at least one of: the time of the input pulse, the level of the input pulse, the voltage on the energy storage capacitor, the power supply energy; sensing a discharged voltage of the energy storage capacitor after the pulse and adjusting another control parameter, sensing current flow through the load using one or more of a Hall effect sensor, a resistor in series with the current loop, a flyback voltage from the parasitic inductor, and a photo sensor looking at the light output of the LED or laser diode load.

\* \* \* \* \*